United States Patent
Li et al.

(10) Patent No.: US 9,747,520 B2
(45) Date of Patent: Aug. 29, 2017

(54) SYSTEMS AND METHODS FOR ENHANCING INSPECTION SENSITIVITY OF AN INSPECTION TOOL

(71) Applicant: KLA-TENCOR CORPORATION, Milpitas, CA (US)

(72) Inventors: Shifang Li, Pleasanton, CA (US); Youxian Wen, Fremont, CA (US); Sven Schwitalla, Portland, OR (US); Prashant Aji, San Jose, CA (US); Lena Nicolaides, Castro Valley, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/068,320

(22) Filed: Mar. 11, 2016

(65) Prior Publication Data
US 2016/0275671 A1 Sep. 22, 2016

Related U.S. Application Data

(60) Provisional application No. 62/133,959, filed on Mar. 16, 2015.

(51) Int. Cl.
*G06T 7/00* (2017.01)
*G06T 7/40* (2017.01)
*G06T 5/50* (2006.01)
*G06K 9/62* (2006.01)
*H04N 5/225* (2006.01)
*H04N 9/07* (2006.01)

(52) U.S. Cl.
CPC .............. *G06K 9/6201* (2013.01); *G06T 5/50* (2013.01); *G06T 7/001* (2013.01); *H04N 5/2256* (2013.01); *G06T 2207/10016* (2013.01); *G06T 2207/10024* (2013.01); *G06T 2207/20224* (2013.01); *G06T 2207/30148* (2013.01)

(58) Field of Classification Search
CPC ......... G06K 9/6201; G06T 5/50; G06T 7/001; H04N 5/2256
See application file for complete search history.

(56) References Cited

U.S. PATENT DOCUMENTS

| | | | |
|---|---|---|---|
| 5,050,230 A * | 9/1991 | Jones | G06F 17/30277 358/1.9 |
| 2002/0150306 A1* | 10/2002 | Baron | H04N 5/2354 382/275 |
| 2005/0002021 A1 | 1/2005 | Kreh et al. | |
| 2007/0121106 A1 | 5/2007 | Shibata et al. | |
| 2007/0253033 A1* | 11/2007 | Johansen | G01N 21/8851 358/448 |
| 2008/0285840 A1 | 11/2008 | Kawai | |

(Continued)

*Primary Examiner* — David F Dunphy
(74) *Attorney, Agent, or Firm* — Hodgson Russ LLP

(57) ABSTRACT

Systems and methods for enhancing inspection sensitivity to detect defects in wafers using an inspection tool are disclosed. A plurality of light emitting diodes illuminate at least a portion of a wafer and capture a set of grayscale images. A residual signal is determined in each image of the grayscale image set and the residual signal is subtracted from each image of the grayscale image set. Defects are identified based on the subtracted grayscale image set. Models of the inspection tool and wafer may be built and refined in some embodiments of the disclosed systems and methods.

17 Claims, 11 Drawing Sheets

(56) References Cited

U.S. PATENT DOCUMENTS

| | | | |
|---|---|---|---|
| 2010/0189374 A1* | 7/2010 | Tsukioka | G06T 5/002 382/266 |
| 2012/0057050 A1* | 3/2012 | Ashdown | G03B 15/02 348/234 |
| 2013/0216129 A1 | 8/2013 | Wang | |
| 2013/0271596 A1 | 10/2013 | Lewis et al. | |
| 2016/0202177 A1 | 7/2016 | Li et al. | |

* cited by examiner

SYSTEMS AND METHODS FOR ENHANCING INSPECTION SENSITIVITY OF AN INSPECTION TOOL

CROSS-REFERENCE TO RELATED APPLICATIONS

This application claims priority to U.S. Provisional Application No. 62/133,959, filed on Mar. 16, 2015, now pending, the disclosure of which is incorporated herein by reference.

FIELD OF THE DISCLOSURE

The present disclosure relates to systems and methods for enhancing inspection sensitivity of an inspection tool, such as a metrology tool.

BACKGROUND OF THE DISCLOSURE

Wafer inspection systems help semiconductor manufacturers increase and maintain integrated circuit (IC) chip yields. The IC industry employs inspection systems to detect defects that occur during the manufacturing process. Their main purpose is to monitor whether the process is under control. If the process is outside the scope of established norms, the system should indicate the problem and/or the source of the problem, which a manager of the IC fabrication process can fix. Some important inspection system characteristics are defect detection sensitivity and wafer throughput. Sensitivity and throughput are coupled such that greater sensitivity usually means lower throughput. There are both physical and economic reasons for this relationship.

The relative value of sensitivity and throughput depends on the function of the inspection system. There are three general functional requirements for these systems: first, detecting and classifying defects in process development, second, in monitoring a process line, and third, in monitoring a station. In process development one may tolerate low throughput in order to capture smaller defects and a greater range of defect types. However, in monitoring a production line or a station, cost-of-ownership, and thus throughput, becomes relatively more important. In this case, of course, the sensitivity must be adequate to capture the yield-limiting defects.

Evolution of the semiconductor manufacturing industry is placing ever greater demands on yield management and in particular, on metrology and inspection systems. Critical dimensions are shrinking while wafer size is increasing. Economics is driving the industry to decrease the time for achieving high-yield, high-value production. Thus, minimizing the total time from detecting a yield problem to fixing it determines the return-on-investment for the semiconductor fabricator.

Thus, inspection systems are evolving from stand-alone "tools" that just found defects to a part of a more complete solution where detecting defects, classifying them, analyzing these results and recommending corrective action are their functions.

Existing systems and methods have been used for automatic defect inspection of semiconductor wafers. However, the inspection parameters of prior art systems and methods are rather limited in a high-throughput environment. For example, parameters such as coated film thickness or the process uniformity across the wafer are time-consuming and computationally expensive.

Present systems capture grayscale images of a semiconductor wafer under all possible combinations of red, green, and blue LED illumination. The grayscale images are currently used for automatic defect detection on semiconductor wafers, or to detect wafer-to-wafer process variation (G-view).

BRIEF SUMMARY OF THE DISCLOSURE

One embodiment of the present disclosure is a method for identifying defects in a wafer with an inspection tool. The method comprises the step of capturing a grayscale image set of the wafer by using an electronic image capture device of the inspection tool. The grayscale image set may be captured by illuminating at least a portion of the wafer with a blue wavelength light and capturing a first grayscale image, illuminating at least a portion of the wafer with a red wavelength light and capturing a second grayscale image, and illuminating at least a portion of the wafer with a green wavelength light and capturing a third grayscale image. In one embodiment, the method may further comprise illuminating at least a portion of the wafer with a combination of blue, red, or green wavelength light and capturing one or more additional grayscale images.

The method may further comprise storing the grayscale image set into a computer-readable memory.

The method may further comprise determining, using a processor in communication with the computer-readable memory, a residual signal in each of the images of the grayscale image set based on a combination of the images in the grayscale image set. The residual signal may be determined by building, using the processor, a rigorous mathematical model of defect detection using the inspection tool; determining one or more model parameters, using the processor, based on a known standard grayscale image set (such as a VLSI thin film standard image set); building, using a processor, a model of the wafer using the one or more model parameters, the model based on design values or previously measured values (such as model parameters); predicting, using the model of the wafer, grayscale signals by using the model of the wafer and the rigorous mathematical model; adjusting one or more parameters of the model of the wafer until a best match is found between the predicted grayscale signals and measured grayscale signals from the wafer; reporting, using the processor, the one or more parameters corresponding to the best match models as the measured sample parameters; calculating, using the processor, a residual signal based on differences between the predicted grayscale and measured grayscale on the wafer; and storing, in computer-readable memory, the calculated residual signal for future defect detection.

The method may further comprise subtracting, using the processor, the residual signal of each image of the grayscale image set from each image of the grayscale image set.

The method may further comprise identifying, using the processor, a defect in the wafer based on the subtracted grayscale image set.

The method may further comprise converting the grayscale image set captured by the image capture device using an analog-to-digital converter.

The method may further comprise importing wafer information into the computer-readable memory, wherein the step of calculating a residual signal in each of the images of the grayscale image set is further based on the imported wafer information. The wafer information may be in GDSII format. The wafer information may also be automatically imported by the processor.

The method may further comprise capturing, using the electronic image capture device of the inspection tool, additional grayscale image set of a wafer after the wafer has been modified; determining, using the processor in communication with the computer-readable memory, a residual signal in each of the images of the additional grayscale image set based on a combination of the images in the additional grayscale image set; subtracting, using the processor, the residual signal of each image in the additional grayscale image set from each image in the additional grayscale image set; and identifying, using the processor, a defect in the wafer based on differences between the grayscale image sets.

One embodiment of the present disclosure may be described as an enhanced inspection tool system. The system may comprise a control processor and an electronic image capture device in electronic communication with the control processor. The system may further comprise a plurality of light emitting diodes, each light emitting diode configured to emit a different wavelength of light. The plurality of light emitting diodes may be in electronic communication with the control processor.

The system may further comprise a computer-readable memory in electronic communication with the image capture device and an analysis processor in electronic communication with the computer-readable memory. In one embodiment, the system may further comprise an analog-to-digital converter configured to convert the grayscale image set for storage in the computer-readable memory.

The control processor may be configured to instruct the plurality of light emitting diodes to illuminate at least a portion of a wafer with a blue, red, and green wavelength light and capturing a first, second, and third grayscale image.

The control processor may also be configured to instruct the electronic image capture device to capture a grayscale image set of a wafer. Each image of the set captured may be done while at least a portion of the wafer is illuminated by the plurality of light emitting diodes. The control processor may also be configured to store the grayscale image set into the computer-readable memory. The control processor may be further configured to instruct the plurality of light emitting diodes to illuminate at least a portion of the wafer with a combination of blue, red, and green wavelength light and capture an additional grayscale image under the combined light.

The analysis processor may be configured to determine a residual signal in each of the images of the grayscale image set retrieved from the computer-readable memory based on a combination of the images in the grayscale image set. The analysis processor may determine a residual signal in each of the images of the grayscale image set by: building, using the analysis processor, a rigorous mathematical model of defect detection using the inspection tool; determining one or more model parameters, using the analysis processor, based on a known standard grayscale image set; building, using the analysis processor, a model of the wafer using the one or more model parameters, the model based on design values or previously measured values; predicting, using the model of the wafer, grayscale signals by using the model of the wafer and the rigorous mathematical model; adjusting one or more parameters of the model of the wafer until a best match is found between the predicted grayscale signals and measured grayscale signals from the wafer; reporting, using the analysis processor, the one or more parameters corresponding to the best match models as the measured sample parameters; calculating, using the analysis processor, a residual signal based on differences between the predicted grayscale and measured grayscale on the wafer; and storing, in the computer-readable memory, the calculated residual signal for future defect detection.

The analysis processor may be further configured to subtract the residual signal of each image of the grayscale image set from each image of the grayscale image set and identify a defect in the wafer based on the subtracted grayscale image set. The analysis processor may be further configured to import wafer information from the computer-readable memory and determine a residual signal in each of the images of the grayscale image set further based on the imported wafer information. The wafer information may be in GDSII format.

The control processor may be further configured to instruct the electronic image capture device to capture an additional grayscale image set of a wafer after the wafer has been modified. In such an embodiment, the analysis processor may be further configured to determine a residual signal in each of the images of the additional grayscale image set based on a combination of the images in the additional grayscale image set, subtract the residual signal of each image in the additional grayscale image set from each image in the additional grayscale image set, and identify a defect in the wafer based on differences between the grayscale image sets.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure.

Embodiments of the systems and methods disclosed herein enable quantitative monitoring of sample parameters and provide improved inspection capabilities. The system generates more reliable and measurable quantities per point on the wafer per wavelength. This increases possible applications and improves results. Extracting sample parameters from an inspection tool can aid in detection of process parameter drift, which will enable semiconductor manufacturers to take preventive or corrective action.

As used herein, the term "wafer" generally refers to substrates formed of a semiconductor or non-semiconductor material. Examples of such a semiconductor or non-semiconductor material include, but are not limited to, monocrystalline silicon, gallium arsenide, indium phosphide, sapphire, and glass. Such substrates may be commonly found and/or processed in semiconductor fabrication facilities.

A wafer may include one or more layers formed upon a substrate. For example, such layers may include, but are not limited to, a photo resist, a dielectric material, a conductive material, and a semiconductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features or periodic structures. Formation and processing of such layers of material may ultimately result in completed devices. Many different types of devices may be formed on a wafer, and the term wafer as used herein is intended to encompass a wafer on which any type of device known in the art is being fabricated.

Figure 6:
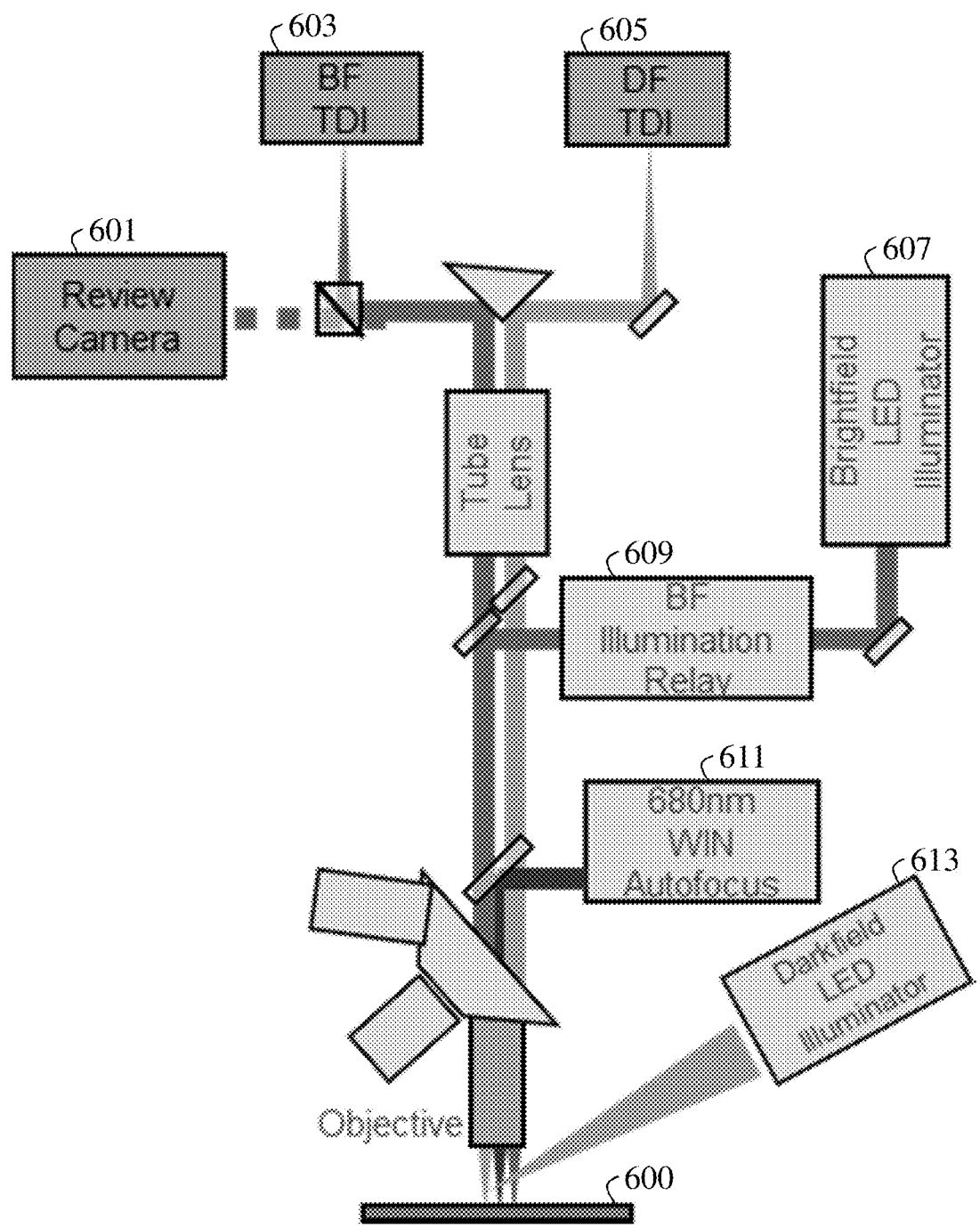
FIG. 6 is an exemplary imaging device used in a system or method of the present disclosure.

Embodiments of the disclosed systems and methods extract information from existing data in a mathematically rigorous way. In one embodiment, grayscale signal from the bright field channel 603 of the system in FIG. 6 is obtained via scan through a part of a wafer or the full wafer area, with pre-determined illumination light source, namely any combinations of the red, green and blue LEDs. The system in FIG. 6 is calibrated using prior data analysis. The calibration process can be performed by analyzing the grayscale signal when the system scans one or more wafers with known surface structure, such as VLSI thin film standards. This calibration process finds all parameters for a rigorous mathematical model of the system in FIG. 6. During the data analysis on the wafers under test, the model with pre-determined parameters from the calibration process are used, in additional to rigorously modeling the structures on the wafer. The results of the rigorously modeled sample and system of FIG. 6 are predicted grayscale signals. The predicted grayscale signals are then compared with the measured grayscale signal by the system. A best match between the predicted signal and measured signal is obtained by adjusting the parameter of the samples under test, such as thicknesses of the films, optical constants of materials, and/or critical dimension (CD) of some patterned features. The parameters that give the best match are reported as the measurement results.

Figure 1:
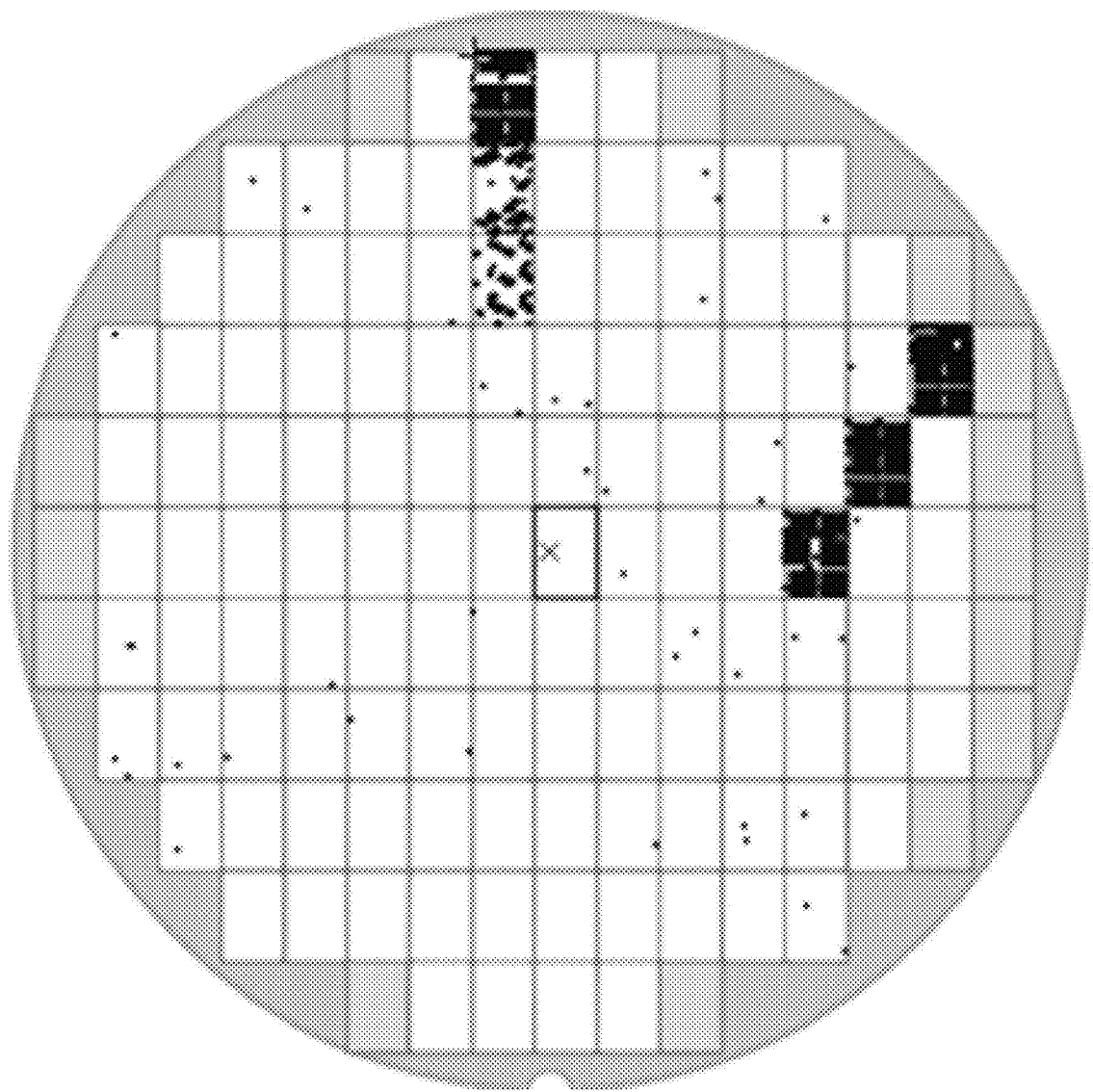
FIG. 1 is a drawing illustrating detection of defects on a wafer using a system or method of the present disclosure.
Figure 2:
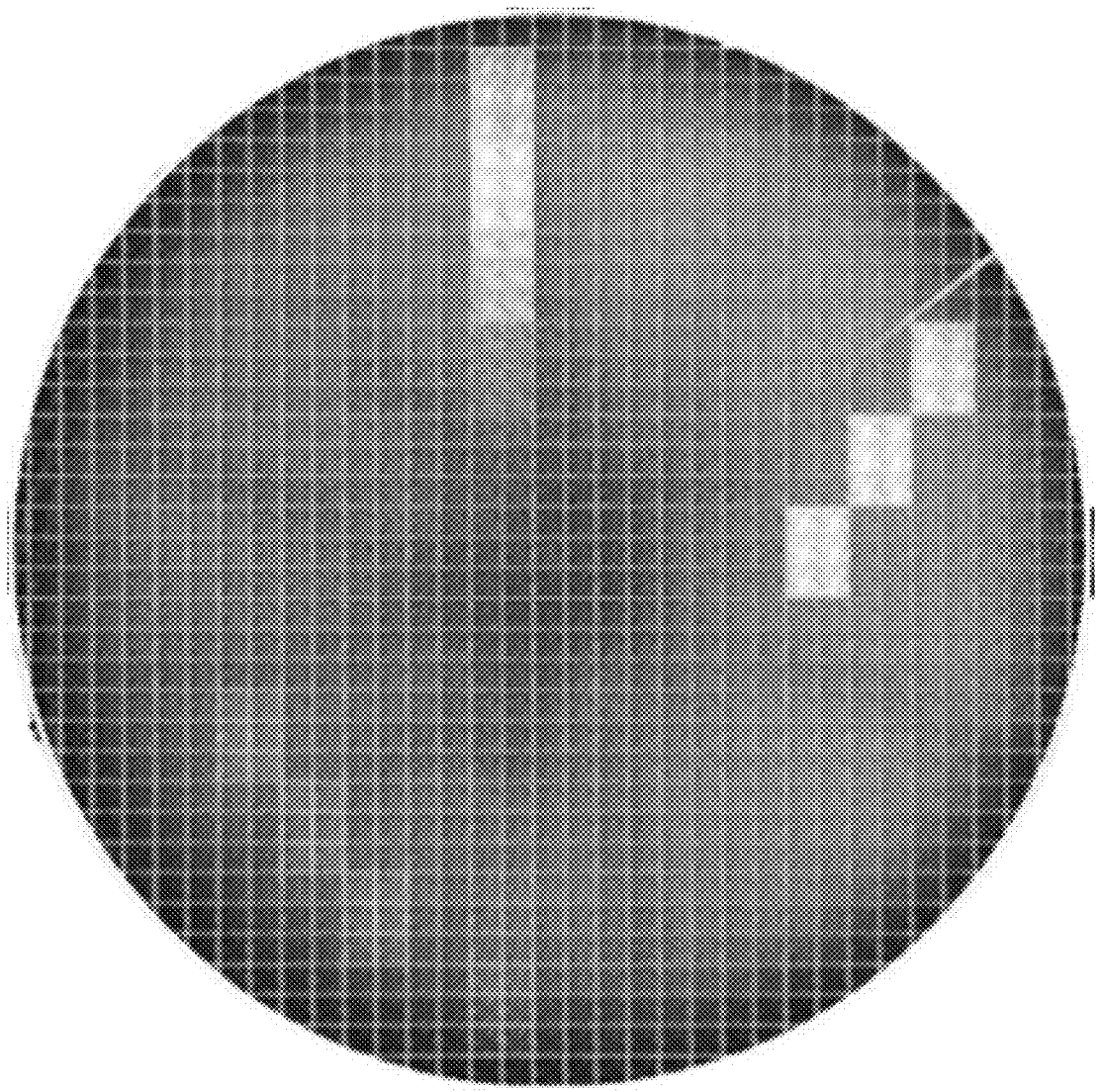
FIG. 2 is a drawing illustrating detection of process drift from wafer-to-wafer using a system or method of the present disclosure.
Figure 3C:
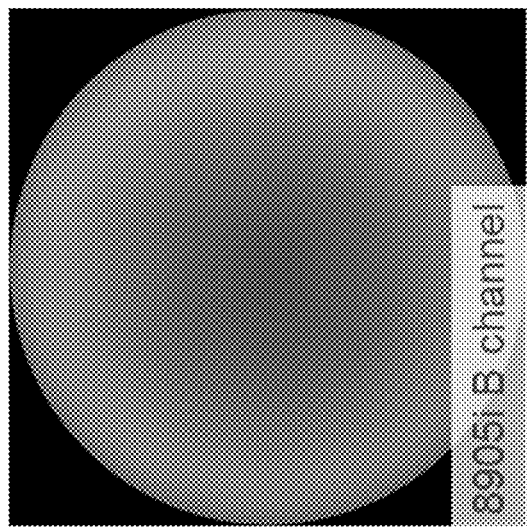
FIGS. 3a-3b are exemplary grey level image with red illuminated (FIG. 3a), green illuminated (FIG. 3b), and blue illuminated (FIG. 3c) of a semiconductor wafer using a system or method of the present disclosure.
Figure 3B:
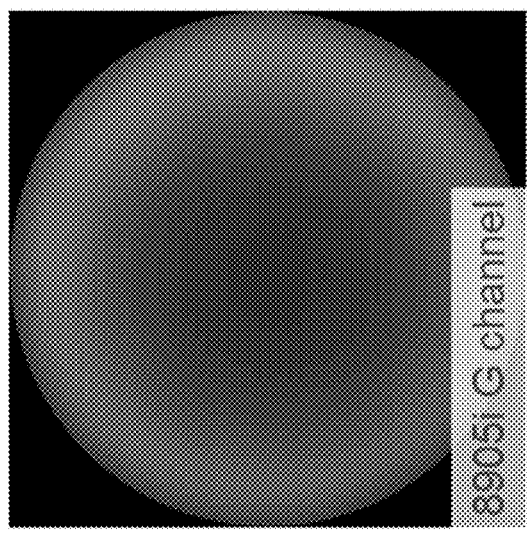
Figure 3A:
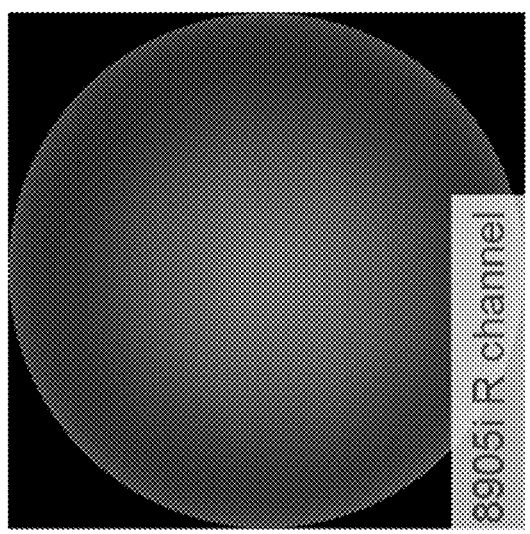
Figure 4A:
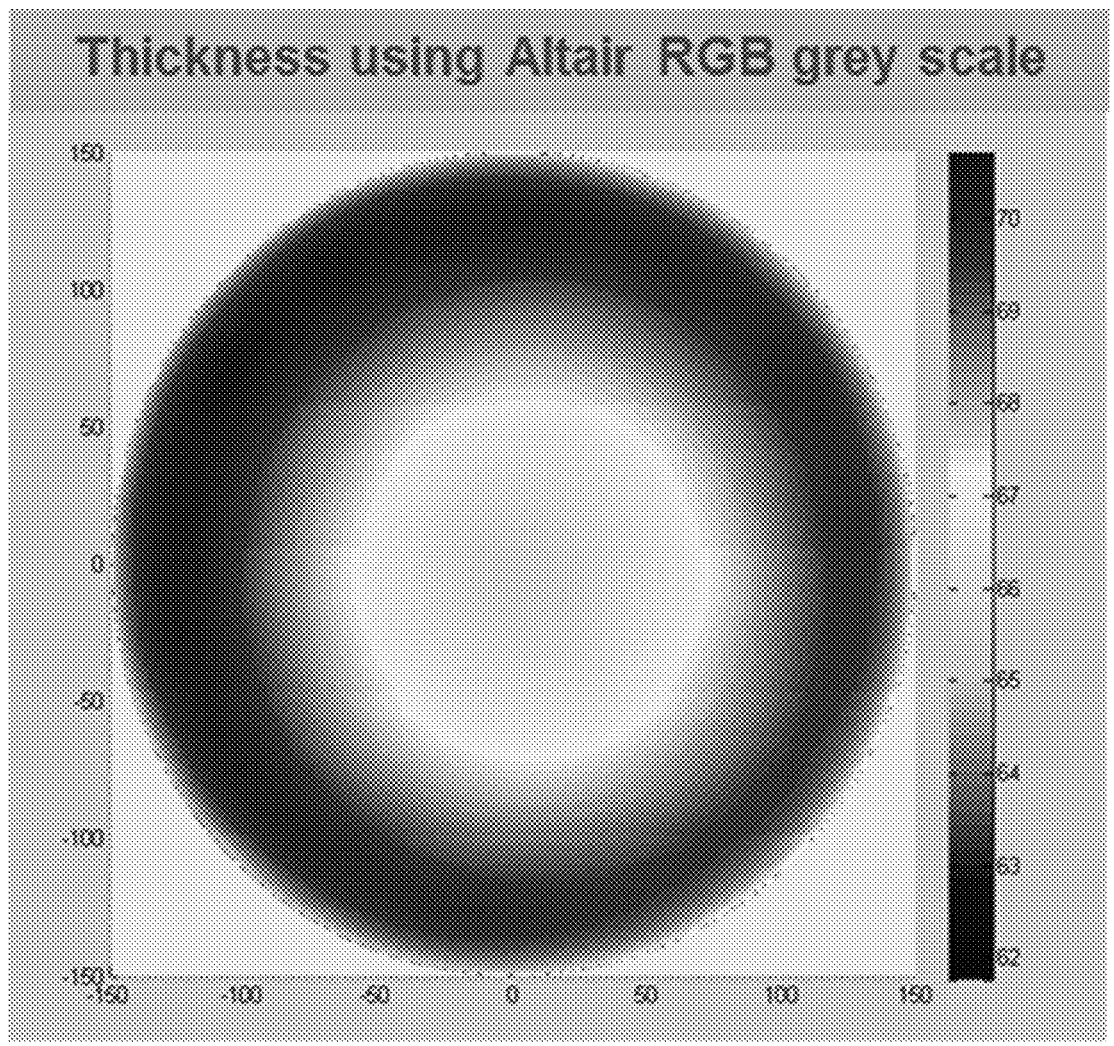
FIG. 4a is a diagram showing wafer map of thickness as measured using a system or method of the present disclosure.
Figure 4B:
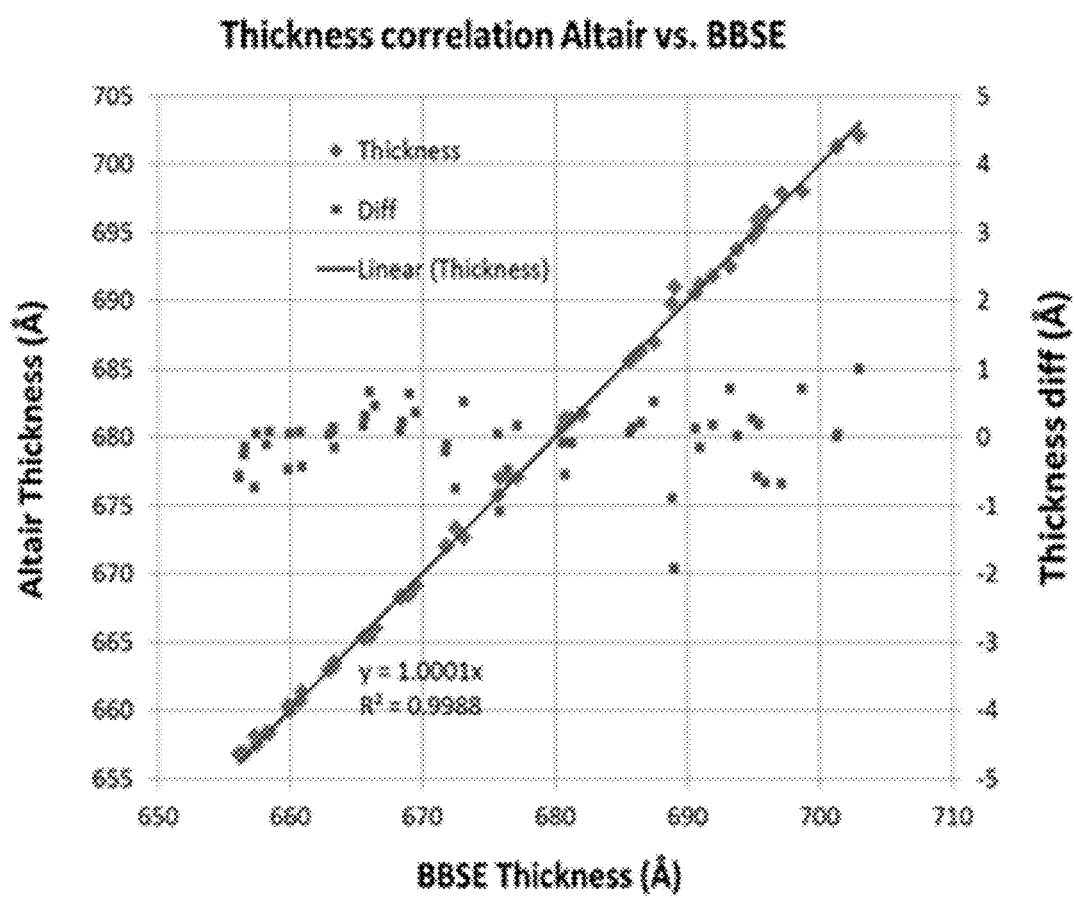
FIG. 4b is a diagram showing a comparison of the data captured in FIGS. 4a and 4c.
Figure 4C:
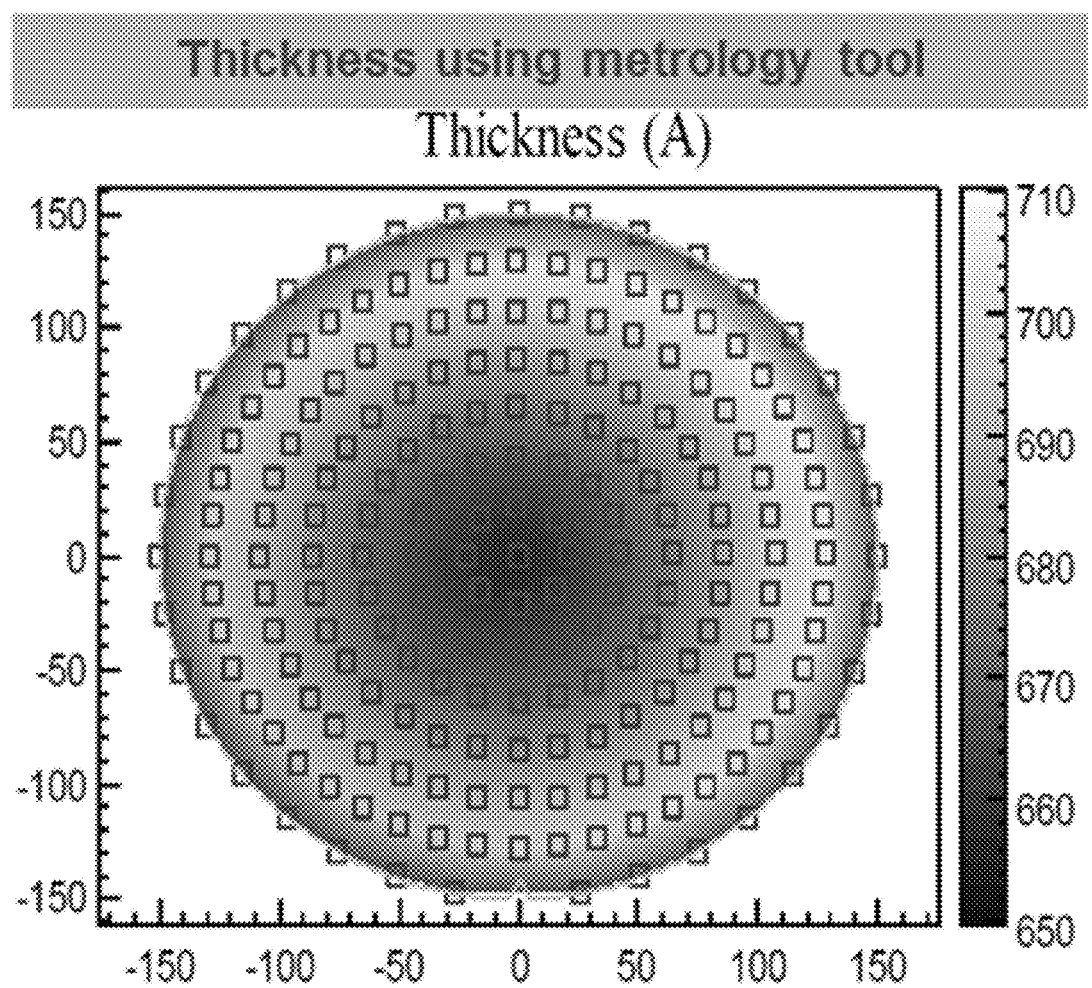
FIG. 4c is a diagram showing wafer map of thickness as measured using a metrology tool.

In one embodiment, a rigorous modeling method is applied to an automatic optical inspection device, such as shown in FIG. 6. As the method improves the performance of inspection system, the grayscale signal (as illustrated in FIGS. 3*a-c*) becomes increasingly precise. By rigorously analyzing or modeling the grayscale data, embodiments of the present disclosure can measure sample parameters such as thicknesses of thin film stack using grayscale data from the optical inspection device. FIG. 4*a* shows the thickness of a semiconductor wafer as determined using systems and methods of the present disclosure, via the calibration and data analysis processes described herein. FIG. 4*c* shows thickness of the same semiconductor wafer as determined by a well-established accuracy but time-consuming metrology tool. FIG. 4*b* illustrates the accuracy of the presently disclosed systems and methods in comparison to the metrology tool by plotting the results from two of the methods on the diagonal. For clarity, the difference between them is plotted as the squares in FIG. 4*b*.

In another embodiment, defect detection sensitivity may be increased by applying a rigorous modeling method to original grayscale imaging. In one example, an exemplary bright-field RGB grayscale image, such as the images in FIGS. 3*a-c* may be captured. An RGB grayscale image may be a set of grayscale images of the wafer or of a portion of the wafer illuminated by a red, green, or blue light. Each image in the set may correspond to an image captured under a different color of light. The major component of grayscale variation across the imaged wafer is due in part to film thickness variation in the wafer. After mathematically removing the signal caused by film thickness variation, the residual signal can be found as shown in FIGS. 5*a-c*.

Figure 5A:
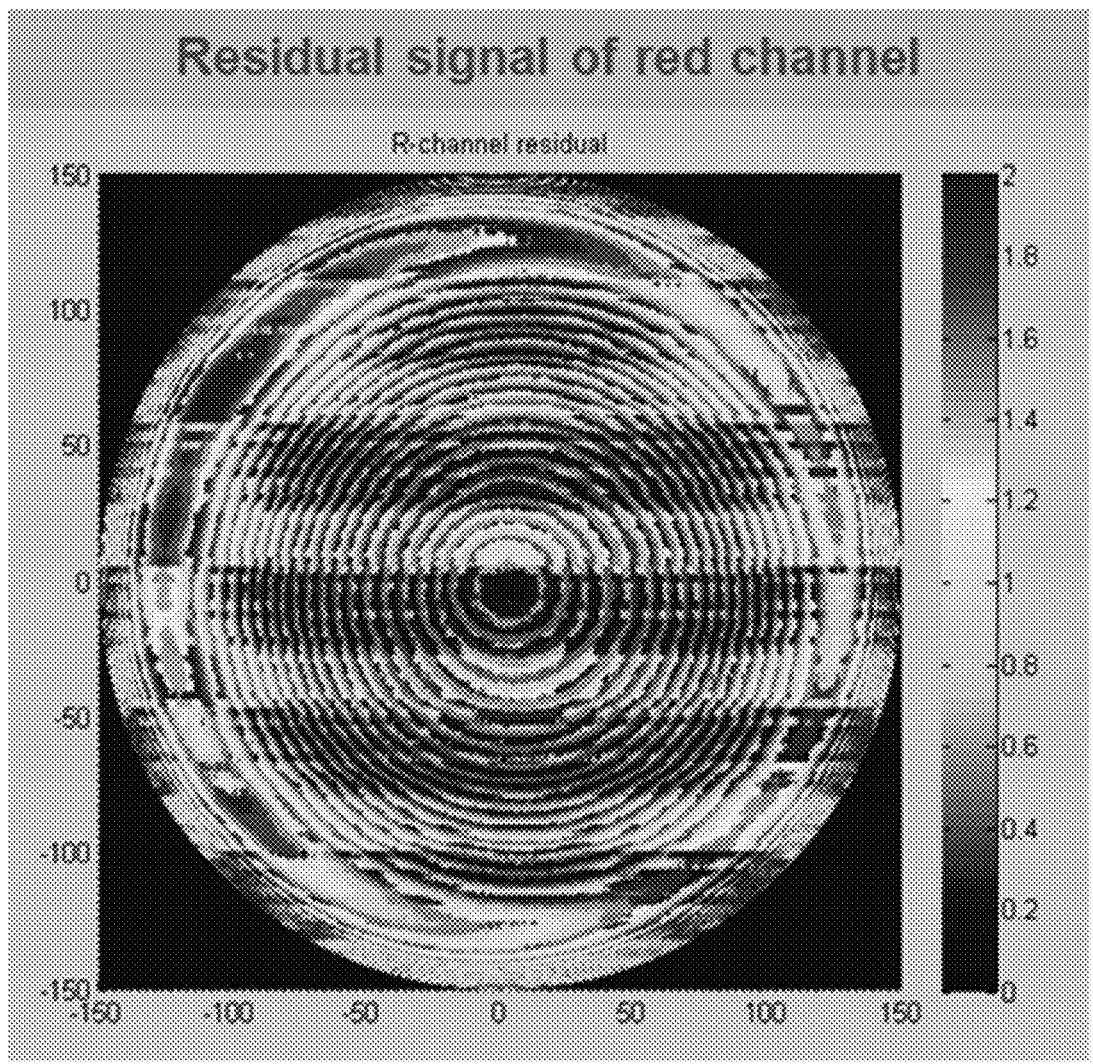
FIGS. 5a-c are diagrams showing the residual signal of red, green, and blue channels after signal from thickness variation being removed using a system or method of the present disclosure.
Figure 5B:
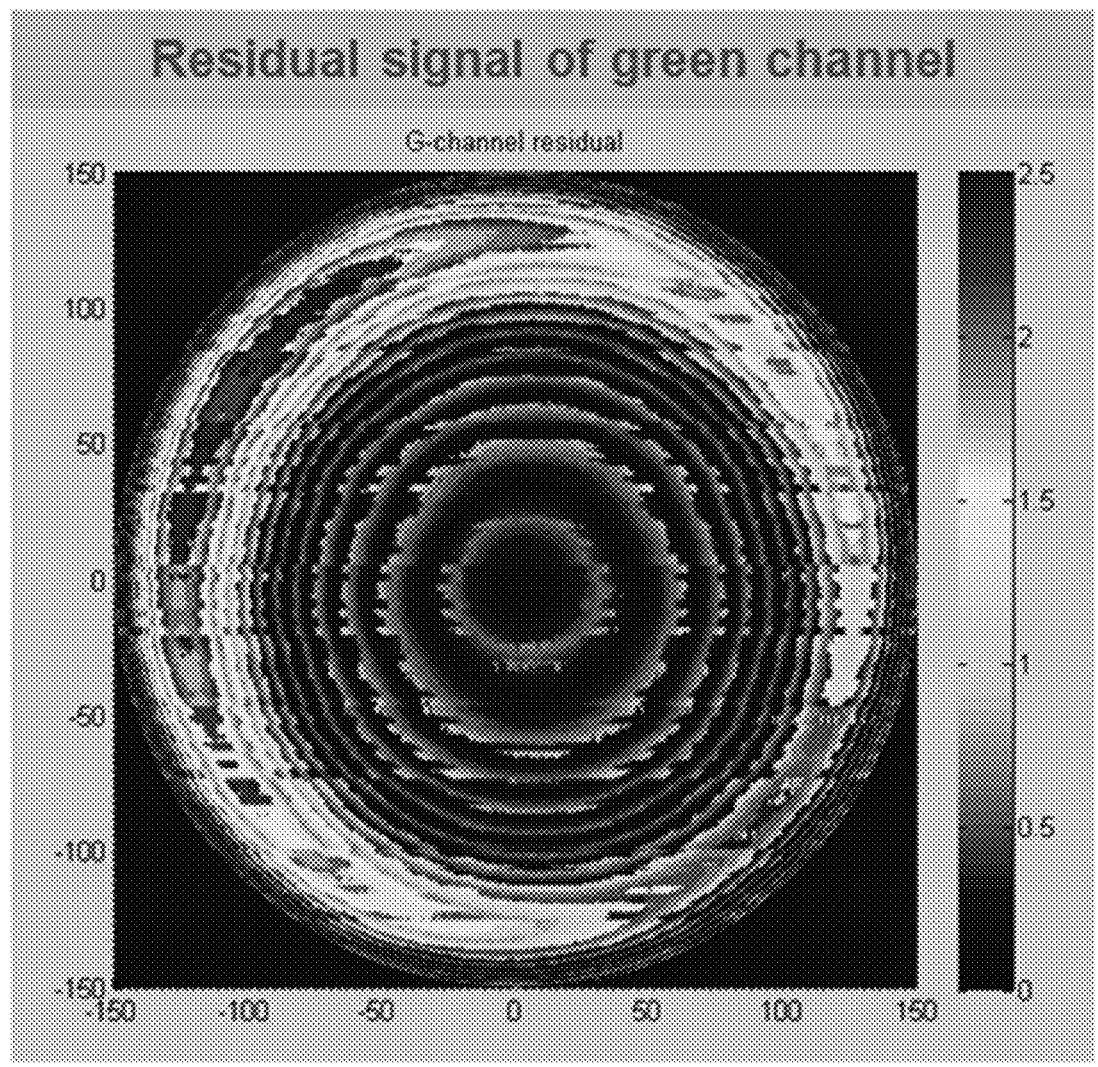
Figure 5C:
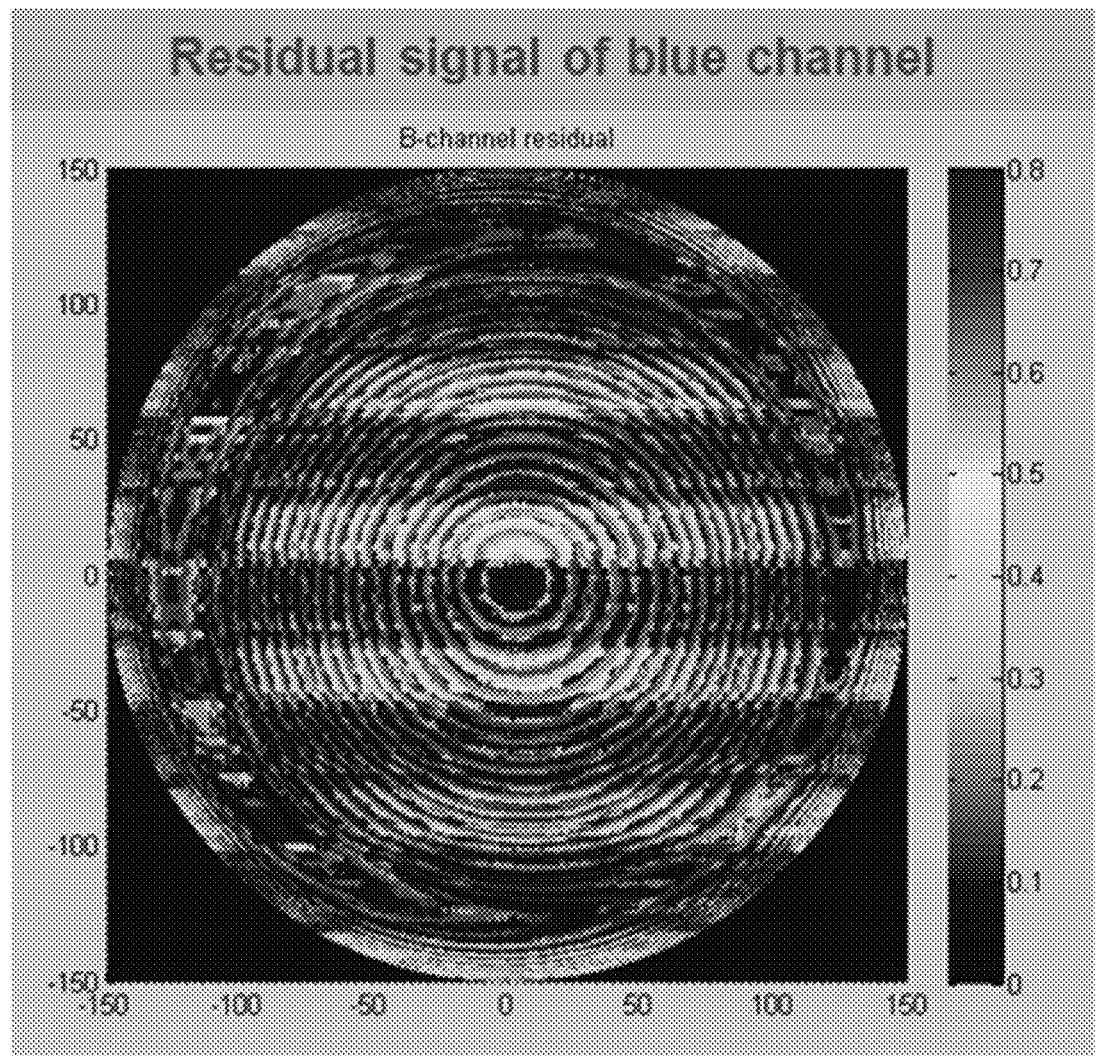

For example, there are three major data components shown within FIGS. 5*a-c*: (a) the abnormal feature inside the ring between radii range 110-150 mm especially in the upper-left range is a process non-uniformity that causes the optical property of the film to behave differently from a normal value; (b) the ring-type and horizontal strip-type feature is a known hardware limitation in the exemplary embodiment; and (c) after removing the hardware signature described in (b), the image reveals defects that have a weak signal in a sub digitized-count. As such, the defect-detection sensitivity of the system will be improved after removing the major thickness variation components.

In another embodiment, the capabilities of the present disclosure can be expanded by collecting and analyzing multiple sets of grayscale images taken on the same wafer but at different time during the wafer process. For example, one set of grayscale images may be captured after each film layer deposition process. In one embodiment a set of grayscale image may be taken after the pre-lithography layer, ARC layer, and photo resist layer. Another set of grayscale images may be taken after developing the pattern. When all the sets of grayscale images are analyzed together, the thickness of all the films as well as the CD value of the patterned structure can be measured. In addition, after removing the major signal component due to film thickness and CD variation from the original sets of RGB grayscale images, process variations and small defects can be detected at all process steps with higher sensitivity.

In another embodiment, film stack and/or patterned structures information may be imported into the rigorous analysis. The stack and/or patterned structure information at the location of interest, for example, may be imported from a GDSII file or other suitable type of file. The information may be imported either automatically or manually. Film stacks and/or patterned structures may have different responses to incident of light, angle of incident and azimuth, numeric aperture, wavelength, polarization, etc. Variation of those unique film stacks and/or patterned structures within the die or field, within the wafer, and between wafers may reflect variations in the wafer manufacturing process. Such variations can be detected and can be separated and/or decoupled by applying algorithms, such as smart image analysis, and/or rigorously modeling the system. For example, after the major component of grayscale variation via thickness variation of FIG. 3a-c is subtracted, the residual grayscale variation can be determined as shown in FIG. 5a-c. The outer ring in FIG. 5a shows high residual, and can be identified because the film optical property is different from other area during the wafer process. This may be a process tool defect that causes material property variation and would not have been detected without removing the major grayscale variation by thickness variation. The same algorithm can be applied to find more types of defects related to process or process tools.

FIG. 6 is a diagram of one type of hardware used to capture grayscale images of a wafer. FIG. 6 illustrates an embodiment of a wafer inspection system in which maximum flexibility over the illumination spectra is desired. The wafer inspection system shown in FIG. 6 includes wafer 600, objective lens, turret, bright-field illuminator 607, illumination relay optics 609, auto-focus unit 611, beamsplitter, tube lens, review camera 601, and dark-field illuminator 613. In order to achieve spatial separation, the fields of view of the detectors 603 and 605 must fit within the field of view of objective lens without overlap. The use of linescan CCD or TDI (time delay and integration) CCD sensors facilitates this goal, because these sensors have footprints that are long and thin. However, the bright-field and dark-field detectors are not limited to linescan CCD or TDI CCD sensors and may be alternatively implemented with any other suitable sensor. Although using TDI detector is one of the exemplary embodiment, there are many advantages by using TDI detectors. By using TDI detector, the system, such as shown in FIG. 6, can drive a scan of wafer relative to detection field-of-view continuously moving while taking grayscale signal, and output swaths that has length only limited by wafer size. This may be important when a Power-Spectral-Density (PSD) is desired from the measurement. The PSD is a Fourier transfer of the quantity measured. To cover a wide range of the spatial frequency range of measured PSD from one measurement, use of a small pixel size that extends a high frequency end, and also long measurement length that extends a low frequency end may be desired. The ratio of total scan length to pixel size gives the total number of pixels along the scan direction. For TDI, this can be larger than 1,000,000 (for example, 300 mm long line with 0.3 micro pixel size), and this provides six orders of magnitude of spatial frequency coverage during one TDI scan. In contrast, with strobe technology, this ratio is limited by number of pixels in the detector, typically less than 2,000 for automatically optical inspection tools in semiconductor industry. That means the TDI scheme can provide more than 500 times wider spatial frequency coverage range in one measurement. Other advantages of using TDI include faster and higher resolution.

The reflected light and the scattered light collected by the objective lens are converged into real images by the tube lens. In one embodiment, the bright-field and dark-field images may be separated into the appropriate detection channels by a double-sided mirror in the shape of a prism. However, there are many other suitable optical components that could be used to separate the bright-field and dark-field images.

In one embodiment, the dark-field image is focused directly onto the dark-field detector 605. On the bright-field side, a majority of the bright-field light is focused onto the bright-field detector 603. However, a small portion of the bright-field light may be split off by a cube beamsplitter and directed to a review camera 601. Review camera 601 may be used to acquire color images of the specimen under inspection. In some cases, an additional optical element may be placed between a beamsplitter and review camera 601 to adjust the image magnification in accordance with the imaging requirements.

A beamsplitter, an optical element, and review camera 601 may not be included in all embodiments of the invention. If eliminated, the bright-field image from the double-sided mirror may be focused directly onto the bright-field detector 603. It is also worth noting that the beamsplitter, optical element, and review camera 601 may be added to other embodiments including bright-field inspection.

Output signals from the bright-field and dark-field detectors may be conveyed to a computer (not shown) for further processing. Because the two channels are separated spatially, the bright-field and dark-field detectors are able to acquire bright-field and dark-field images of the wafer at substantially the same time. This improves throughput (over systems capable of providing only one mode at a time) and increases sensitivity to a wider range of defects by enabling the detector output signals to be combined before defects are determined. In addition to bright-field and dark-field defects, the output signals may be combined to locate defects that can only be detected in the bright-field difference versus dark-field difference decision space.

The output signals from the two detectors may be supplied to one or more computer systems (not shown) for further processing. For example, the output signals may be supplied to a processor (not shown). The processor may be coupled to the two detectors by a transmission medium (not shown). The transmission medium may include any suitable transmission medium known in the art. In addition, the processor may be coupled to the detector by one or more electronic components (not shown) such as an analog to digital converter. In this manner, the processor may be configured to receive output signals from the detectors.

In some embodiments, the processor may be configured to use the output signals for detecting one or more defects on the specimen. The defects may include any defects of interest on the specimen. In addition, the processor may be configured to perform any other inspection-related functions known in the art (e.g., defect location determination, defect classification, defect mapping, etc.). The processor may take various forms, including a personal computer system, mainframe computer system, workstation, image computer, parallel processor, or any other processing device known in the art. In general, the term "computer system" may be broadly defined to encompass any device having one or more processors, which executes instructions from a memory medium. The processor may be generally configured to use the output signals and any method and/or algorithm known in the art to detect the defects on the specimen.

Figure 7:
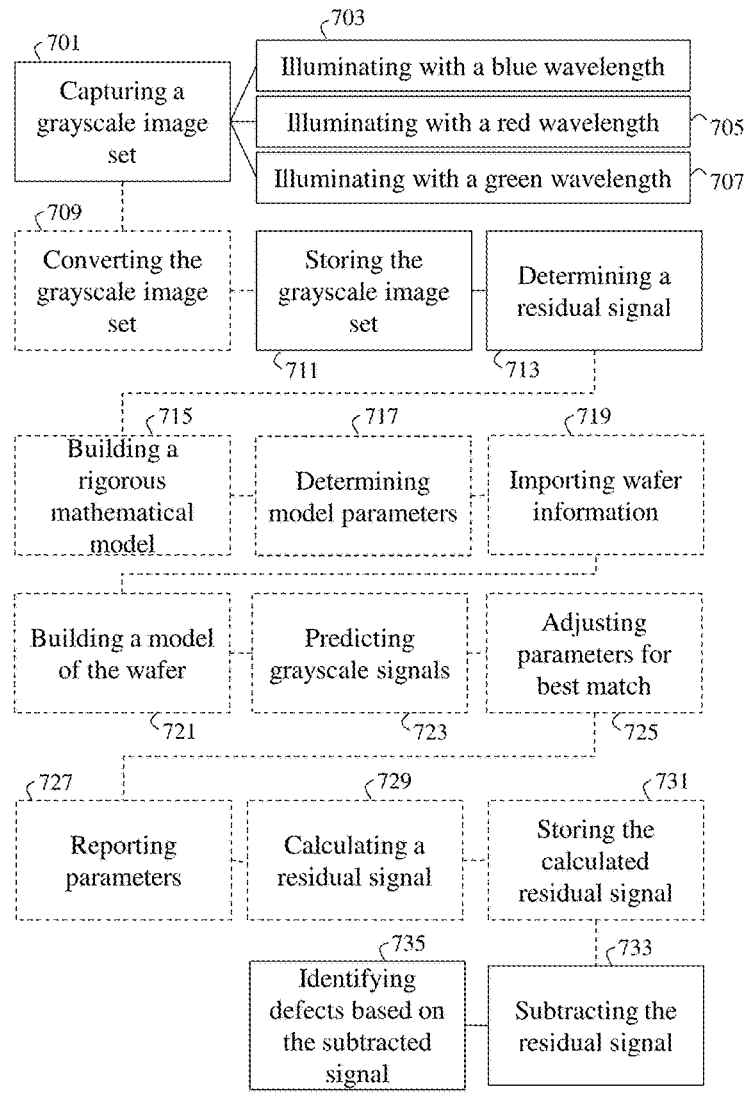
FIG. 7 is a flowchart illustrating an exemplary embodiment of the present disclosure.

FIG. 7 is a flowchart of one embodiment of the present invention. This particular embodiment is a method comprises the step of capturing 701 a grayscale image set of the wafer by using an electronic image capture device of the inspection tool. The grayscale image set may be captured 701 by illuminating 703 at least a portion of the wafer with a blue wavelength light and capturing a first grayscale image, illuminating 705 at least a portion of the wafer with a red wavelength light and capturing a second grayscale image, and illuminating 707 at least a portion of the wafer with a green wavelength light and capturing a third grayscale image.

The method may further comprise converting 709 the grayscale image set captured by the image capture device using an analog-to-digital converter. The method may further comprise storing 711 the grayscale image set into a computer-readable memory.

The method may further comprise determining 713, using a processor in communication with the computer-readable memory, a residual signal in each of the images of the grayscale image set based on a combination of the images in the grayscale image set. The residual signal may be determined 713 by building 715, using the processor, a rigorous mathematical model of defect detection using the inspection tool; determining 717 one or more model parameters, using the processor, based on a known standard grayscale image set (such as a VLSI thin film standard image set); building 721, using a processor, a model of the wafer using the one or more model parameters, the model based on design values or previously measured values (such as model parameters); predicting 723, using the model of the wafer, grayscale signals by using the model of the wafer and the rigorous mathematical model; adjusting 725 one or more parameters of the model of the wafer until a best match is found between the predicted 723 grayscale signals and measured grayscale signals from the wafer; reporting 727, using the processor, the one or more parameters corresponding to the best match models as the measured sample parameters; calculating 729, using the processor, a residual signal based on differences between the predicted grayscale and measured grayscale on the wafer; and storing 731, in computer-readable memory, the calculated residual signal for future defect detection.

The method may further comprise importing 719 wafer information into the computer-readable memory, wherein the step of calculating a residual signal in each of the images of the grayscale image set is further based on the imported wafer information. The wafer information may be in GDSII format. The wafer information may also be automatically imported 719 by the processor. The method may further comprise subtracting 733, using the processor, the residual signal of each image of the grayscale image set from each image of the grayscale image set. The method may further comprise identifying 735, using the processor, a defect in the wafer based on the subtracted grayscale image set.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure.

Embodiments of the systems and methods disclosed herein enable quantitative monitoring of sample parameters and provide improved inspection capabilities. The system generates more reliable and measurable quantities per point on the wafer per wavelength. This increases possible applications and improves results. Extracting sample parameters from an inspection tool can aid in detection of process parameter drift, which will enable semiconductor manufacturers to take preventive or corrective action.

In some embodiments, the inspection systems described herein may be configured as "stand alone tools" or tools that are not physically coupled to a process tool. In other embodiments, the inspection systems described herein may be coupled to a process tool (not shown) by a transmission medium, which may include wired and wireless portions. The process tool may include any process tool known in the art such as a lithography tool, an etch tool, a deposition tool, a polishing tool, a plating tool, a cleaning tool, or an ion implantation tool. The process tool may be configured as a cluster tool or a number of process modules coupled by a common handler. Alternatively, the inspection systems described herein may be integrated into a process tool such as those described above. In some cases, the results of inspection performed by the systems described herein may be used to alter a parameter of a process or a process tool using a feedback control technique, a feedforward control technique and/or an in situ control technique. The parameter of the process or the process tool may be altered manually or automatically.

Embodiments of the present disclosure may allow sample parameters from an inspection tool to be extracted and process parameter drift to be detected at an early stage in order to allow preventative action. In doing so, the value of the inspection tool may be increased without significant cost.

Although the present disclosure has been described with respect to one or more particular embodiments, it will be understood that other embodiments of the present disclosure may be made without departing from the spirit and scope of the present disclosure. Hence, the present disclosure is deemed limited only by the appended claims and the reasonable interpretation thereof.

What is claimed is:

1. A method for identifying defects in a wafer with an inspection tool comprising:
   capturing, using an electronic image capture device of the inspection tool, a grayscale image set of the wafer by:
      illuminating at least a portion of the wafer with a blue wavelength light and capturing a first grayscale image;
      illuminating at least a portion of the wafer with a red wavelength light and capturing a second grayscale image; and
      illuminating at least a portion of the wafer with a green wavelength light and capturing a third grayscale image;
   storing the grayscale image set into a computer-readable memory;
   determining, using a processor in communication with the computer-readable memory, a residual signal in each of the images of the grayscale image set based on a combination of the images in the grayscale image set;
   subtracting, using the processor, the residual signal of each image of the grayscale image set from each image of the grayscale image set; and
   identifying, using the processor, a defect in the wafer based on the subtracted grayscale image set.

2. The method of claim 1, wherein capturing the grayscale image set of the wafer further comprises illuminating at least a portion of the wafer with a combination of blue, red, or green wavelength light and capturing one or more additional grayscale images.

3. The method of claim 1, further comprising converting the grayscale image set captured by the image capture device using an analog-to-digital converter.

4. The method of claim 1, wherein the step of determining a residual signal in each of the images of the grayscale image set comprises:
   building, using a processor, a rigorous mathematical model of defect detection using the inspection tool;
   determining one or more model parameters, using the processor, based on a known standard grayscale image set;
   building, using a processor, a model of the wafer using the one or more model parameters, the model based on design values or previously measured values;
   predicting, using the model of the wafer, grayscale signals by using the model of the wafer and the rigorous mathematical model;

adjusting one or more parameters of the model of the wafer until a best match is found between the predicted grayscale signals and measured grayscale signals from the wafer;

reporting, using the processor, the one or more parameters corresponding to the best match models as the measured sample parameters;

calculating, using the processor, a residual signal based on differences between the predicted grayscale and measured grayscale on the wafer; and storing, in computer-readable memory, the calculated residual signal for future defect detection.

5. The method of claim 4, wherein the known standard grayscale image set is a VLSI thin film standard image set.

6. The method of claim 4, wherein the variables to be measured are model parameters.

7. The method of claim 1, further comprising importing wafer information into the computer-readable memory, wherein the step of calculating a residual signal in each of the images of the grayscale image set is further based on the imported wafer information.

8. The method of claim 7, wherein the wafer information is in GDSII format.

9. The method of claim 7, wherein the wafer information is automatically imported by the processor.

10. The method of claim 1, further comprising:

capturing, using the electronic image capture device of the inspection tool, an additional grayscale image set of a wafer after the wafer has been modified;

determining, using the processor in communication with the computer-readable memory, a residual signal in each of the images of the additional grayscale image set based on a combination of the images in the additional grayscale image set;

subtracting, using the processor, the residual signal of each image in the additional grayscale image set from each image in the additional grayscale image set; and identifying, using the processor, a defect in the wafer based on differences between the grayscale image sets.

11. An enhanced inspection tool system comprising:

a control processor;

an electronic image capture device in electronic communication with the control processor;

a plurality of light emitting diodes, each light emitting diode configured to emit a different wavelength of light, the plurality of light emitting diodes in electronic communication with the control processor;

a computer-readable memory in electronic communication with the image capture device;

an analysis processor in electronic communication with the computer-readable memory;

wherein the control processor is configured to:

instruct the plurality of light emitting diodes to illuminate at least a portion of a wafer with a blue wavelength light and capture a first grayscale image;

instruct the plurality of light emitting diodes to illuminate at least a portion of the wafer with a red wavelength light and capture a second grayscale image; and instruct the plurality of light emitting diodes to illuminate at least a portion of the wafer with a green wavelength light and capture a third grayscale image;

instruct the electronic image capture device to capture a grayscale image set of a wafer, each image of the set captured while at least a portion of the wafer is illuminated by the plurality of light emitting diodes; and store the grayscale image set into the computer-readable memory; and wherein the analysis processor is configured to:

determine a residual signal in each of the images of the grayscale image set retrieved from the computer-readable memory based on a combination of the images in the grayscale image set;

subtract the residual signal of each image of the grayscale image set from each image of the grayscale image set; and identify a defect in the wafer based on the subtracted grayscale image set.

12. The system of claim 11, wherein the control processor is further configured to instruct the plurality of light emitting diodes to illuminate at least a portion of the wafer with a combination of blue, red, and green wavelength light and capture an additional grayscale image under the combined light.

13. The system of claim 11, further comprising an analog-to-digital converter configured to convert the grayscale image set for storage in the computer-readable memory.

14. The system of claim 11, wherein the analysis processor determines a residual signal in each of the images of the grayscale image set by:

building, using the analysis processor, a rigorous mathematical model of defect detection using the inspection tool;

determining one or more model parameters, using the analysis processor, based on a known standard grayscale image set;

building, using the analysis processor, a model of the wafer using the one or more model parameters, the model based on design values or previously measured values;

predicting, using the model of the wafer, grayscale signals by using the model of the wafer and the rigorous mathematical model;

adjusting one or more parameters of the model of the wafer until a best match is found between the predicted grayscale signals and measured grayscale signals from the wafer;

reporting, using the analysis processor, the one or more parameters corresponding to the best match models as the measured sample parameters;

calculating, using the analysis processor, a residual signal based on differences between the predicted grayscale and measured grayscale on the wafer; and storing, in the computer-readable memory, the calculated residual signal for future defect detection.

15. The system of claim 11, wherein the analysis processor is further configured to import wafer information from the computer-readable memory and determine a residual signal in each of the images of the grayscale image set based on the imported wafer information.

16. The system of claim 15, wherein the wafer information is in GDSII format.

17. The system of claim 11, wherein the control processor is further configured to instruct the electronic image capture device to capture an additional grayscale image set of a wafer after the wafer has been modified; and wherein the analysis processor is further configured to:

determine a residual signal in each of the images of the additional grayscale image set based on a combination of the images in the additional grayscale image set;

subtract the residual signal of each image in the additional grayscale image set from each image in the additional grayscale image set; and identify a defect in the wafer based on differences between the grayscale image sets.

\* \* \* \* \*

UNITED STATES PATENT AND TRADEMARK OFFICE
CERTIFICATE OF CORRECTION

PATENT NO. : 9,747,520 B2
APPLICATION NO. : 15/068320
DATED : August 29, 2017
INVENTOR(S) : Li et al.

It is certified that error appears in the above-identified patent and that said Letters Patent is hereby corrected as shown below:

In the Specification

Column 2, Lines 37-39 should read:
--predicting grayscale signals by using the model of the wafer--;

Column 3, Lines 57-59 should read:
--predicting grayscale signals by using the model of the wafer--;

Column 4, Line 38 should read:
--FIGS. 3a-3c--;

In the Claims

Column 10, Line 62, in Claim 4, should read:
--using the processor--;

Column 10, Lines 65-66, in Claim 4 should read:
--predicting grayscale signals by using the model of the wafer--; and Column 12, Lines 38-39, in Claim 14 should read:
--predicting grayscale signals by using the model of the wafer--.

Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*